US008824586B2

(12) United States Patent  
Arad et al.

(10) Patent No.: US 8,824,586 B2  
(45) Date of Patent: Sep. 2, 2014

(54) ANTENNA POINTING FOR MULTIPLE-INPUT-MULTIPLE-OUT (MIMO) DEVICES

(75) Inventors: Seyed Mohammad Ali Arad, Richmond Hill (CA); Frank van Heeswyk, Toronto (CA)

(73) Assignee: Taqua WBH, LLC, Richardson, TX (US)

( * ) Notice: Subject to any disclaimer, the term of this patent is extended or adjusted under 35 U.S.C. 154(b) by 135 days.

(21) Appl. No.: 13/412,222

(22) Filed: Mar. 5, 2012

(65) Prior Publication Data

US 2013/0230088 A1 Sep. 5, 2013

(51) Int. Cl.  
*H04L 1/02* (2006.01)

(52) U.S. Cl.  
USPC .......................................... 375/267

(58) Field of Classification Search  
USPC ......... 375/267, 224, 228, 346, 347, 348, 349; 370/252, 310, 331; 455/277, 436; 343/894  
See application file for complete search history.

(56) References Cited

U.S. PATENT DOCUMENTS

| | | |
|---|---|---|
| 6,937,188 B1 | 8/2005 | Saunders et al. |
| 7,688,898 B1 | 3/2010 | Lou et al. |
| 2003/0083016 A1 | 5/2003 | Evans et al. |
| 2006/0116092 A1 | 6/2006 | Uno et al. |
| 2006/0230429 A1 | 10/2006 | Van Horck |
| 2008/0095263 A1 | 4/2008 | Xu et al. |
| 2009/0051618 A1 | 2/2009 | Park et al. |
| 2009/0163206 A1* | 6/2009 | Adatrao et al. ............... 455/436 |
| 2010/0120415 A1 | 5/2010 | Urquhart et al. |
| 2011/0092209 A1* | 4/2011 | Gaal et al. ..................... 455/436 |
| 2011/0201368 A1 | 8/2011 | Faccin et al. |
| 2013/0035051 A1* | 2/2013 | Mujtaba et al. ............ 455/277.2 |

OTHER PUBLICATIONS

International Search Report and Written Opinion issued for PCT/US2013/024408, dated Jun. 14, 2013; 14 pages.

* cited by examiner

*Primary Examiner* — Khai Tran  
(74) *Attorney, Agent, or Firm* — Fulbright & Jaworski LLP

(57) ABSTRACT

Performance in multiple-input-multiple-output (MIMO) antenna systems may be enhanced by configuring beams in a direction that reduces coupling between the beams. A decoupling metric may be calculated based on signal strengths received through the beams when an antenna system is pointed in different directions. The decoupling metric may be used to select a particular direction for operation of the antenna system. The decoupling metric may be combined with the signal strengths from each beam to select a direction for the antenna. An interface provides information to a user during positioning of the antenna to allow the user to select a direction for placement of the antenna that reduces coupling between beams in the MIMO antenna system.

25 Claims, 4 Drawing Sheets

ANTENNA POINTING FOR MULTIPLE-INPUT-MULTIPLE-OUT (MIMO) DEVICES

FIELD OF THE INVENTION

The instant disclosure relates to telecommunications. The instant disclosure more specifically relates to configuring antennas in a multiple-input-multiple-output (MIMO) antenna system.

BACKGROUND

Some wireless communication systems use directional antennas having a narrow beam at the transmitter and/or receiver units. An example of these systems is microwave point-to-point links that use directional antennas at both ends of the links. Another example is a wireless backhaul system with point-to-multipoint connections. These systems may have an antenna with a wide beam at a hub and an antenna with a narrow beam at each receiver unit.

Multiple-input-multiple-output (MIMO) spatial multiplexing transmission may be implemented in wireless communications systems to increase channel capacity. For example, a 2×2 MIMO configuration provides two input beams and two output beams at the transmitter and the receiver units. The beams may originate from one, two, or more antennas. The beams contain streams of data transmitted in parallel from the antennas.

Spatial multiplexing MIMO works well when there is sufficient isolation between the beams. One way of achieving isolation is through signal diversity. Signal diversity may be achieved through polarization, spatial, or angular differences provided with respect to the beams. For example, signal diversity may be achieved by transmitting signals using two beams with orthogonal polarizations.

The isolation between transmitted MIMO signals may be reduced by environmental conditions. For example, a transmission path encountering multipath interference from a number of reflections may decrease isolation between the signals as received by beams adapted for different signal diversity (e.g., polarization, bore site angle, spatial separation, etc.). For example, part of the signal transmitted on one polarization may experience a change in its polarization in the communications path and be received on the antenna with a different polarization in the receiver unit. Lower isolation results in reduced MIMO performance.

In wireless systems with narrow beam antennas at remote nodes the antenna direction can impact the communications path, such as to cause a low receive signal strength or poor isolation between MIMO streams. Conventionally, an antenna is configured to maximize the received signal strength indicator (RSSI) on a single beam. This conventional antenna pointing method may be useful for systems with single-input-single-output (SISO) transmission. However, for systems with MIMO spatial multiplexing transmission, antenna pointing solely based on RSSI may not guarantee acceptable MIMO performance, because the RSSI does not provide any information regarding isolation of the beams. For example, in a deep non-line-of-sight (NLOS) environment, the direction with the strongest RSSI may not have sufficient isolation between two MIMO channels

SUMMARY

The present invention is directed to systems and methods that employ a decoupling metric for providing feedback during antenna pointing. A decoupling metric may be computed for beams received at a MIMO antenna system and used in properly orienting the MIMO antenna system for providing optimized or otherwise improved MIMO performance, for determining whether MIMO communication techniques are to be implemented, and the like. For example, a MIMO antenna system may include one or more antennas providing one or more signal diversity attribute (e.g., polarization diversity, angular diversity, spatial diversity, etc.) with respect to signals transmitted and/or received by the antenna system. The decoupling metric provides a quantitative evaluation of cross-coupling between the signals (e.g., antenna beam signals) received by the MIMO antenna system. Using the decoupling metric, the MIMO antenna system may be configured to optimize or improve performance of data transmission with the MIMO antenna system.

The decoupling metric may be calculated to determine if the communications path established between a remote node and a hub is capable of handling MIMO transmission. The decoupling metric indicates to a user an amount of overlap of signal between a first beam and a second beam at a receiver. When interference in the communications path reduces isolation between two beams of a MIMO transmission, the decoupling metric will be reduced according to embodiments of the invention. If the decoupling metric falls below a threshold, MIMO transmission may be unacceptable.

The decoupling metric may additionally or alternatively be calculated to assist a user during installation of a MIMO antenna system for a remote node. When installing and configuring the MIMO antenna system, the one or more antennas may be pointed in a first direction followed by calculation of a decoupling metric for the first direction. The one or more antennas may then be pointed in a second direction followed by calculation of a decoupling metric for the second direction. The values may be compared to determine which direction provides better isolation of the beams, and thus better MIMO performance.

The decoupling metric and other indicators, such as signal strength, may be communicated to a user through a combination of audible announcements and visual indicators. For example, an audible announcement may indicate a value for a decoupling metric and a visual indicator may indicate a received signal strength.

Communications over a wireless backhaul network, having remote nodes coupled to a central hub, may achieve higher data throughput with improved MIMO operation. The MIMO operation may be improved by identifying antenna system configurations with improved isolation, indicated by a higher decoupling metric.

According to one embodiment, a method includes measuring a first signal strength from a first beam of an antenna system pointed in a first direction. The antenna system may include one or more antennas. The first signal strength is indicative of a signal intended for reception on the first beam. The method also includes measuring a second signal strength from a second beam of the antenna system pointed in the first direction. The second signal strength is indicative of the signal intended for reception on the first beam but received on the second beam. The method further includes computing a first decoupling metric from the first signal strength and the second signal strength. The method also includes determining whether the decoupling metric exceeds a threshold value for multiple-input-multiple-output (MIMO) operation of the antenna.

According to another embodiment, a computer program product includes a non-transitory computer-readable medium having code to measure a first signal strength from a first beam of an antenna system pointed in a first direction. The first signal strength is indicative of a signal intended for reception on the first beam. The medium also includes code to measure a second signal strength from a second beam of the antenna system pointed in the first direction. The second signal strength is indicative of the signal intended for reception on the first beam but received on the second beam. The medium further includes code to compute a first decoupling metric from the first signal strength and the second signal strength. The medium also includes code to determine whether the decoupling metric exceeds a threshold value for multiple-input-multiple-output (MIMO) operation of the antenna system.

According to a further embodiment, an apparatus includes an interface to an antenna system. The apparatus also includes a memory and a processor coupled to the memory and the interface. The processor is configured to measure a first signal strength from a first beam of an antenna system pointed in a first direction. The first signal strength is indicative of a signal intended for reception on the first beam. The processor is also configured to measure a second signal strength from a second beam of the antenna system pointed in the first direction. The second signal strength is indicative of the signal intended for reception on the first beam but received on the second beam. The processor is further configured to compute a first decoupling metric from the first signal strength and the second signal strength. The processor is also configured to determine whether the decoupling metric exceeds a threshold value for multiple-input-multiple-output (MIMO) operation of the antenna system.

According to another embodiment, a method includes indicating a first antenna-pointing metric for an antenna system through an audible announcement. The method also includes indicating a second antenna-pointing metric for an antenna system through a visual indicator.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features that are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

In providing wireless communications in accordance with embodiments of the invention, a decoupling metric is defined and calculated for optimizing or otherwise improving multiple-input-multiple-output (MIMO) antenna system operation. The decoupling metric may be utilized in a method in analyzing and selecting placement of a MIMO antenna system for improved performance. In particular, the decoupling metric may be used to compare different antenna pointing configurations for a MIMO antenna system and/or provide real-time feedback during adjustment of the MIMO antenna system. The decoupling metric provides a measure for evaluating MIMO performance separate from single-input-single-output (SISO) performance. Monitoring the decoupling metric during pointing of the MIMO antenna system may improve performance and/or decrease installation time of MIMO antenna systems with narrow beams.

Figure 1:
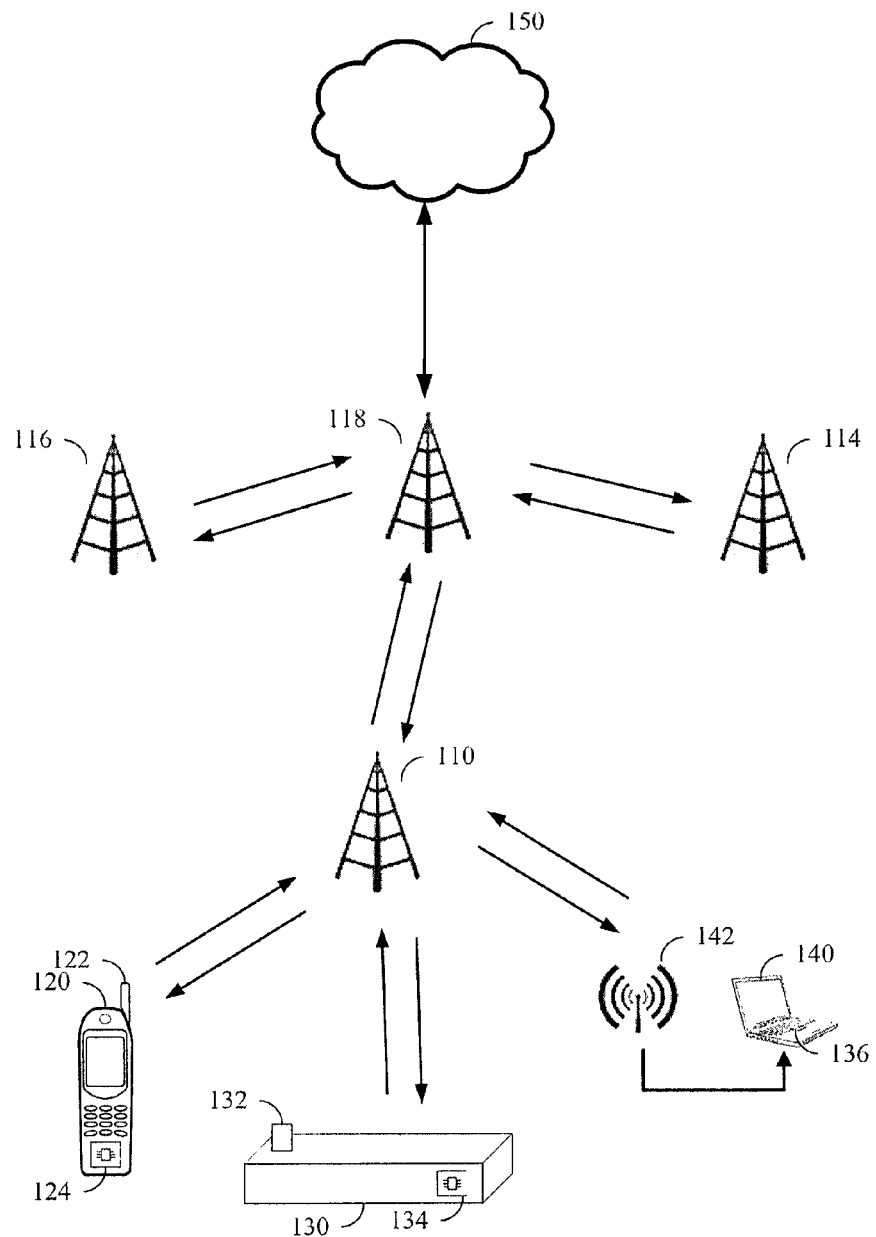
FIG. 1 is a block diagram illustrating a wireless network with multiple-input-multiple-output (MIMO) capable remote nodes according to one embodiment of the disclosure.

FIG. 1 is a block diagram illustrating a wireless network with MIMO capable remote nodes according to one embodiment of the disclosure. Hub 118 may include one or more antennas for transmitting and receiving data in a SISO or MIMO configuration. The antennas may provide a communications path to remote nodes 110, 114, and 116, such as to provide a backhaul communication link between remote nodes 110, 114, and 116 to hub 118. A MIMO configuration of the one or more antennas provides multiple input and output beams utilizing the one or more antennas.

Signal diversity may be achieved through the use of diversity attributes, such as spatial, angular, or polarization diversity, with respect to the antenna beams used in transmitting and/or receiving the signals. For example, in one configuration, hub 118 includes a single antenna capable of generating two orthogonally polarized beams for transmission to remote nodes 110, 114, and 116. According to one embodiment, hub 118 includes a single antenna, which generates a first beam from a horizontal polarization of the antenna and generates a second beam from a vertical polarization. According to another embodiment, hub 118 includes a single antenna, which generates a first beam from a right-circular polarization and generates a second beam from a left-circular polarization. According to yet another embodiment, hub 118 includes a single antenna, which generates a first beam from a +45 degree slant polarization and generates a second beam from a −45 degree slant polarization. The antenna at hub 118 may be configured for SISO or MIMO operation depending on operating conditions.

Remote nodes 110, 114, and 116 may likewise be equipped with MIMO antenna systems having beam diversity. According to one embodiment, remote nodes 110, 114, and 116 may be configured to transmit narrow beams to hub 118. Hub 118 may communicate with remote nodes 110, 114, and 116 through a wide beam or multiple narrow beams directed to each of the remote nodes 110, 114, and 116. Each remote node 110, 114, and 116 may include circuitry, such as a microprocessor, that coordinates functions within the remote node. For example, a microprocessor in remote node 110 may interface with the antenna system to configure and to monitor the MIMO beams. According to one embodiment, the microprocessor is programmed to monitor received signal strength on each MIMO beam and monitor isolation between MIMO beams. A method for monitoring MIMO beams is discussed further with reference to FIG. 2.

Each remote node 110, 114, and 116 may communicate with user equipment 120, 130, and 140. The user equipment may include, for example, cellular phone 120, set-top box 130, and computer 140. Although not illustrated, other devices such as personal digital assistants (PDAs), network appliances, and the like may communicate with remote node 110. Data may be routed from user equipment 120, 130, and 140 through remote node 110 to hub 118. Hub 118 may have a backhaul link to pass the data to other networks 150.

User equipment 120, 130, and 140 may include antenna systems 122, 132, and 142, respectively. Antenna systems 122, 132, and 142 may be integrated with the user equipment or separately located and coupled to user equipment 120, 130, and 140. For example, antenna system 122 and 132 may be integrated with cellular phone 120 and set-top box 130, respectively. Antenna system 142 may be a separate component coupled to laptop 140. Antennas systems 122, 132, and 142 may include one or more narrow beam antennas configured for SISO or MIMO operation.

User equipment 120, 130, and 140 may also include integrated circuit (IC) devices 124, 134, and 144, such as microprocessors, for performing operations within user equipment 120, 130, and 140, respectively. Each microprocessor 124, 134, and 144 may be coupled to memory (not shown) and an interface for communicating to remote node 110 through antenna systems 122, 132, and 142, respectively. Microprocessors 124, 134, and 144 may process data according to standard protocols, such as transmission control protocol/internet protocol (TCP/IP), or proprietary formats. Antenna systems 122, 132, and 142 may be controlled by processors 124, 134, and 144, respectively, to communicate with remote node 110 through code division multiple access (CDMA), time division multiple access (TDMA), frequency division multiple access (FDMA), and/or orthogonal frequency division multiple access techniques. For example, antenna systems 122, 132, and 142 may communicate according to the global system for mobile communication (GSM). In another example, antenna systems 122, 132, and 142 may communicate according to 3G standards such as wide-band code division multiple access (WCDMA), 4G standards such as long term evolution (LTE) and long term evolution-advanced (LTE-A), and the like. Alternatively, antenna system 122, 132, and 142 may operate in unlicensed spectrum, such as the 2.4 GHz frequency band.

Communications paths between remote node 110 with hub 118 should have enough capacity to handle communications between user equipment 120, 130, 140 and other networks 150. A wired link between remote node 110 and hub 118 may be impractical when remote node 110 is located in a rural area due to a lack of telecommunications infrastructure. A wired link between remote node 110 and hub 118 may also be impractical in certain metropolitan areas due to difficulty in installing wire around other existing structures. MIMO configurations for antennas in remote node 110 providing increased capacity for wireless transmission between hub 118 and remote node 110. The MIMO configuration for remote node 110 may be improved by directing the antenna or antennas at the remote node 110 to create a communication path between remote node 110 and hub 118 that maximizes isolation between beams.

Figure 2:
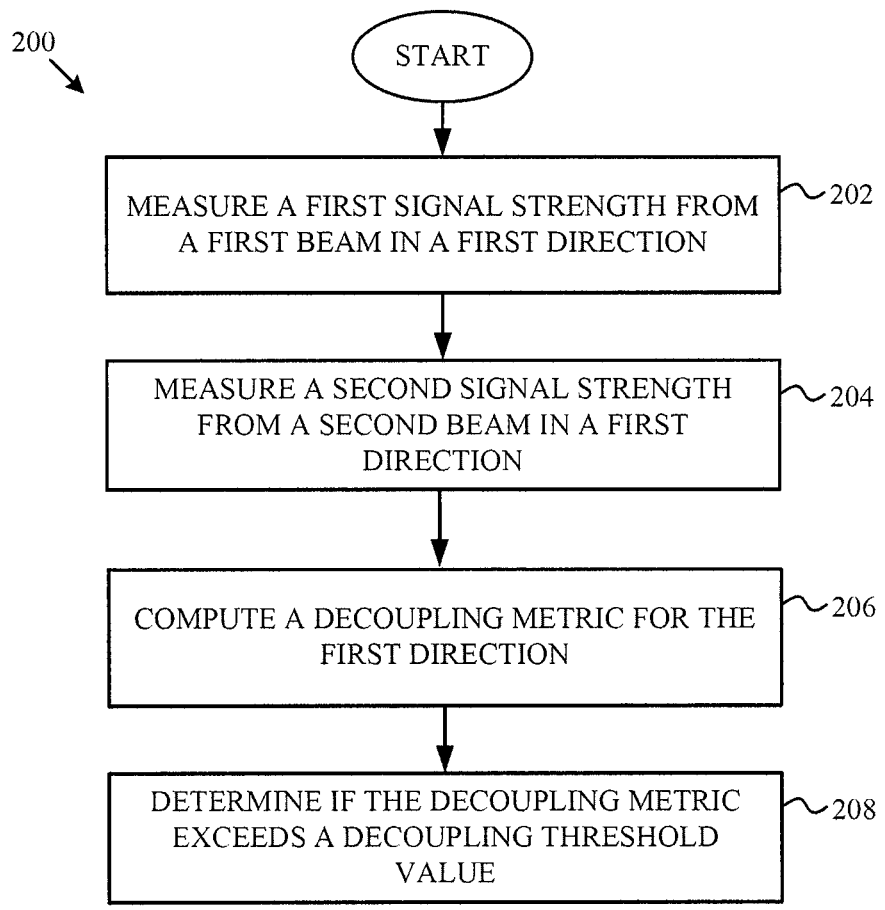
FIG. 2 is a flow chart illustrating a method for measuring signal strength in a MIMO-capable remote node according to one embodiment of the disclosure.

FIG. 2 is a flow chart illustrating a method for measuring signal strength in a MIMO-capable remote node according to one embodiment of the disclosure. Method 200 may be useful for antenna pointing by providing a user an indication of particular pointing configuration that may offer improved MIMO performance. Method 200 is described with reference to the remote node 110, however method 200 may be implemented in any of remote nodes 110, 114, 116, and/or hub 118. Method 200 begins at block 202 with measuring a first signal strength for a first beam of a MIMO antenna system. The first beam may be received from one polarization of multiple possible polarizations of one physical antenna in the antenna system. The first signal strength may be measured through a Received Signal Strength Indicator (RSSI). According to one embodiment, the RSSI value is received from an intermediate frequency (IF) stage of an amplifier in the integrated circuit coupled to remote node 110.

At block 204, a second signal strength is measured from a second beam of the antenna system pointed in the first direction. The second beam may be generated by a second physical antenna or another polarization of the first physical antenna. When the first beam and the second beam are measured, a signal may be transmitted exclusively on one of the beams. According to one embodiment, the signal may be a pilot signal or preamble transmitted from hub 118. Ideally, if the signal is transmitted on the first beam then the signal will be received only on the first beam. Thus, the measured second signal strength would be zero. However, interference, such as multi-path interference, may cause a change in polarization of the transmitted signal, such that some of the signal arrives on the second beam. A decoupling metric computed at block 206 provides a metric for evaluating the amount of coupling that occurs between the first beam and the second beam.

At block 206, a decoupling metric is computed from the first signal strength and the second signal strength. According to one embodiment, the decoupling metric may be computed by determining the absolute difference between the first signal strength and the second signal strength. A higher value for the decoupling metric indicates stronger separation between the first antenna and the second antenna. Thus, a higher decoupling metric may indicate better MIMO performance.

At block 208, it is determined whether the decoupling metric exceeds a threshold value. The threshold value may be set to a value indicating a minimum level of decoupling for MIMO operation. A report may be generated and logged in a file and/or provided to the user through a graphical user interface (GUI). According to one embodiment, remote node 110 may switch operation of the antenna system to single-input-single-output (SISO) operation when poor MIMO performance is indicated by a decoupling metric below the threshold value. According to another embodiment, a user may point the antenna in a different direction and repeat method 200 to determine which antenna pointing configuration offers better performance. Comparing antenna pointing configurations is described in more detail below with reference to FIG. 3.

When the decoupling metric exceeds a threshold value, the signal strength may also be evaluated before configuring MIMO operation. For example, the signal strength may be tested against a signal threshold value. If the signal threshold value and the decoupling threshold value are exceeded, then remote node 110 may operate in MIMO configuration. If either threshold value is not met, then remote node 110 may revert to SISO operation. Alternatively, the antenna system of remote node 110 may be pointed in a second different direction, and method 200 repeated to determine if the second position is acceptable for MIMO operation.

Figure 3:
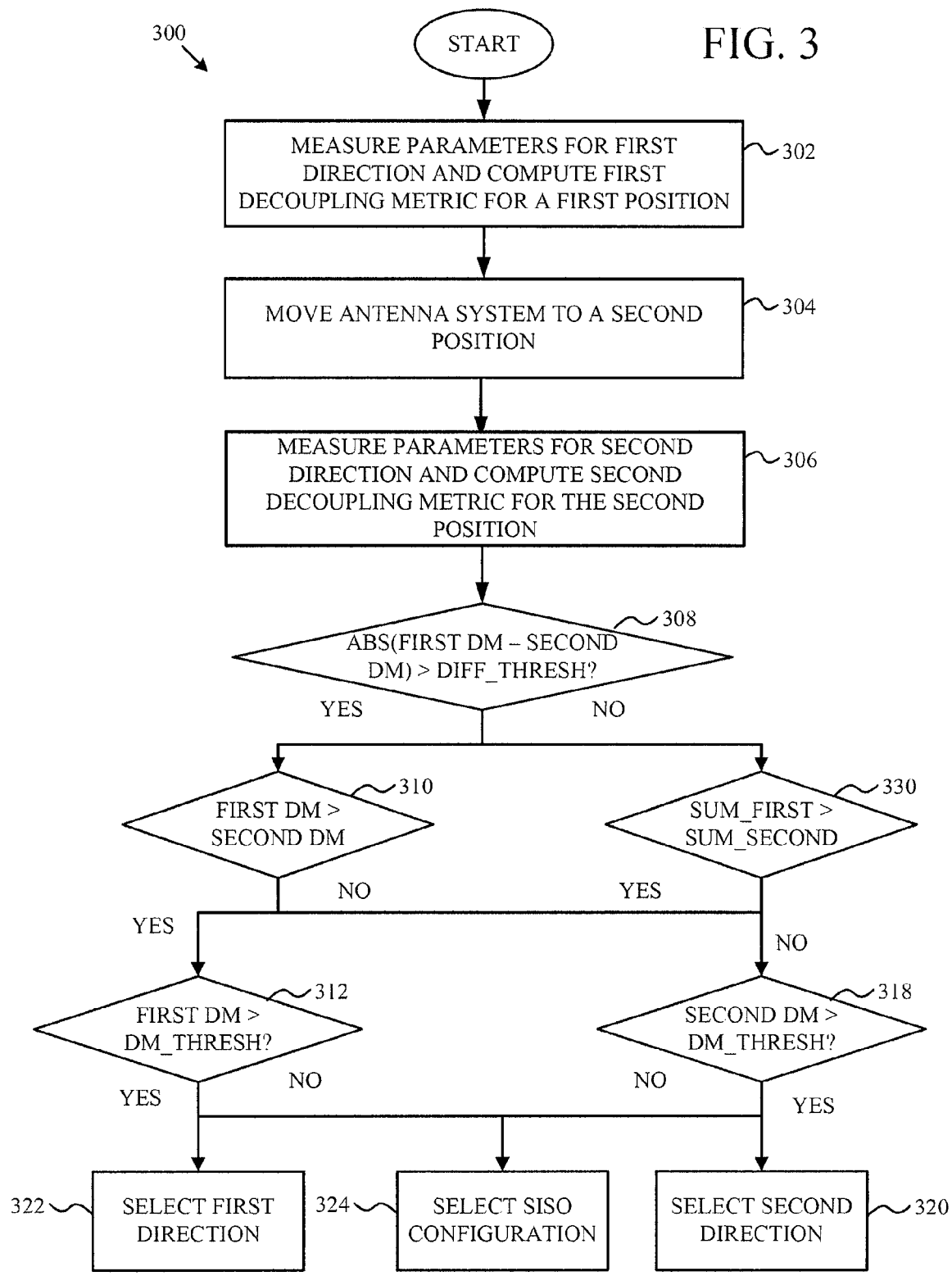
FIG. 3 is a flow chart illustrating a method for optimizing placement of MIMO antennas for remote node operation according to one embodiment of the disclosure.

The measurements and computations performed in the method 200 of FIG. 2 may be utilized in selecting placement and/or direction of a MIMO antenna system. FIG. 3 is a flow chart illustrating a method for optimizing placement of MIMO antennas for remote node operation according to one embodiment of the disclosure. A method 300 may be implemented to select a placement for an antenna system to obtain improved MIMO performance. The method 300 begins at block 302 with measuring parameters for a MIMO antenna system pointed in a first direction. The antenna system may include one antenna with two or more polarizations, two antennas with single polarizations, or a combination of antennas with different polarizations. The measured and computed parameters may include the first signal strength, the second signal strength, and the first decoupling metric described with reference to FIG. 2.

At block 304, the antenna system is moved to point in a second direction. Although the antenna system is referred to as moved, the antenna may be reconfigured in addition to or instead of physically moving the antenna system. According to one embodiment, when the antenna system includes more than one physical antenna, less then all of the physical antennas may be moved or reconfigured.

At block 306, parameters are measured for the MIMO antenna system in the second direction. The parameters may include a third signal strength and a fourth signal strength for the first and second beam, respectively, pointing in the second direction. A second decoupling metric may be computed from the third signal strength and the fourth signal strength.

At block 308, it is determined whether the absolute difference between the first decoupling metric and the second decoupling metric exceeds a difference threshold value. Block 308 may be used to determine when the decoupling metric of two directions is approximately equal, such that a tie breaker using signal strength values should be performed. When the difference threshold value is exceeded, either the first direction or the second direction is a preferred direction for antenna system placement to achieve improved MIMO performance. For example, when the difference threshold value is exceeded and the first decoupling metric is larger than the second decoupling metric, then the first direction is the preferred orientation for MIMO operation of the antenna system.

At block 310, it is determined whether the first decoupling metric is larger than the second decoupling metric. When the first decoupling value is larger than the second decoupling metric, the method 300 proceeds to block 312. When the second decoupling metric is larger than the first decoupling metric, the method 300 proceeds to block 318.

At block 312, it is determined whether the first decoupling value is larger than a threshold value for acceptable MIMO performance. When the first decoupling metric is larger than the decoupling threshold value then the first direction may be selected as the direction for MIMO operation at block 322. When the first decoupling metric is smaller than the threshold value then it is determined that neither the first direction nor the second direction is acceptable for MIMO performance. When MIMO performance is not acceptable, the antenna system may be switched into SISO operation at block 324. Alternatively, the antenna may be pointed in a new direction and the method 300 of FIG. 3 repeated.

When the second decoupling metric is larger than the first decoupling metric at block 310 and the decoupling metric difference exceeds the difference threshold value at block 308, the method 300 continues to block 318 to verify the second direction meets or exceeds a minimum level of MIMO performance. At block 318, it is determined whether the second decoupling metric is larger than a decoupling threshold value for acceptable MIMO performance. When the second decoupling metric is larger than the decoupling threshold value then the second direction may be selected as the direction for MIMO operation at block 320. When the second decoupling metric is smaller than the decoupling threshold value then it is determined that neither the first direction nor the second direction is acceptable for MIMO performance. When MIMO performance is not acceptable, the antenna system may be switched into SISO operation at block 324.

When the difference between the first decoupling metric and the second decoupling metric is less than a threshold value at block 308, additional factors may be considered to assist in selecting between the first direction and the second direction at block 330. At block 330, the other factors for the first direction and the second direction are considered into computing a cumulative score. The cumulative score provides a tiebreaker when the decoupling metric values are approximately equal. If the cumulative score for the first direction exceeds the second direction, then the first direction is selected for MIMO operation at block 322 if the first decoupling metric exceeds a threshold value at block 312. Otherwise, the second direction is selected for MIMO operation at block 320 if the second decoupling metric exceeds a threshold value at block 318. If neither the first decoupling metric nor the second decoupling metric exceeds the decoupling threshold, then the SISO configuration is selected at block 324.

According to one embodiment, the cumulative scores for the first direction and the second direction may be computed by factoring in the signal strength of the first antenna and the second antenna in each direction. For example, the cumulative score for the first direction may include the greater of the first signal strength and the second signal strength. In another example, the cumulative score for the first direction may include a summation of the first signal strength, the second signal strength, and the first decoupling metric. The cumulative score for the second direction may include the greater of the third signal strength and the fourth signal strength. In another example, the cumulative score a summation of the third signal strength, the fourth signal strength, and the second decoupling metric.

Figure 4A:
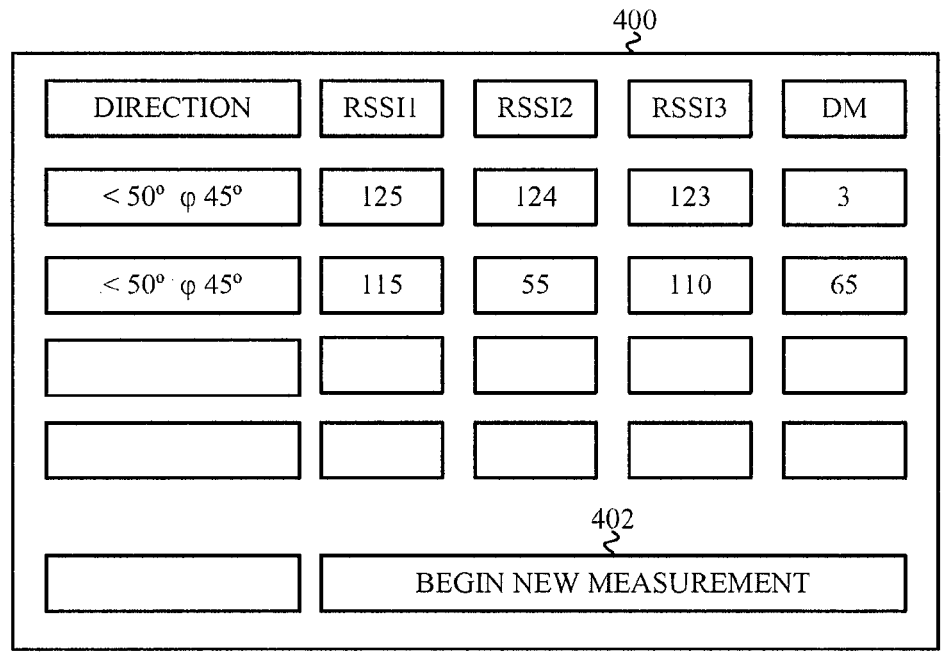
FIG. 4A is a block diagram illustrating an interface for recording signal strength and determining antenna placement according to one embodiment of the disclosure.

The measurements performed in the method 200 of FIG. 2 and the method 300 of FIG. 3 may be reported to a user through a graphical user interface (GUI). FIG. 4A is a block diagram illustrating an interface for recording signal strength and determining antenna system placement according to one embodiment of the disclosure. An interface 400 includes a log of measurement data for signal strength and decoupling metrics for several positions and/or directions of an antenna system. The interface 400 includes a tabular display listing a direction label, signal strength values for each beam measured in a particular direction, and a decoupling metric for the direction. A user may manually rotate an antenna system around the axis, enter a new label for the direction, and click a button 402 to begin a new measurement. The values for the signal strengths and the decoupling metric are then written to the interface 400.

Figure 4B:
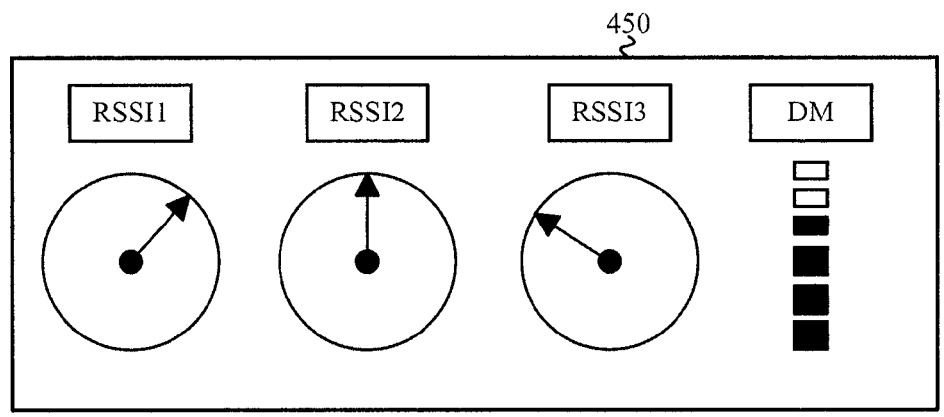
FIG. 4B is a block diagram illustrating an interface for real-time display of MIMO antenna measurements according to one embodiment of the disclosure.

A user interface may alternatively provide a real-time display of measured values for signal strength and decoupling metric. FIG. 4B is a block diagram illustrating an interface for real-time display of MIMO antenna measurements according to one embodiment of the disclosure. A user may be able to switch between the tabular interface of FIG. 4A and the real-time interface of FIG. 4B. An interface 450 may include meters for displaying continuously measured data from an antenna system. The data may be measured, for example, one or more times per second and updated in the interface 450. As a user redirects an antenna the values for the signal strength from each beam and a computed decoupling metric may be displayed in real-time, or near real-time, through the interface 450. An audible signal may accompany the real-time display of the interface 450. For example, a beep sound may change pitch or tempo as the decoupling metric increases or decreases to provide an audible clue to the user adjusting the antenna the best location for MIMO performance.

A combination of audio and video feedback may be provided to a user while installing an antenna to assist the user in pointing the antenna. For example, values for one antenna-pointing metric are displayed graphically to the user while values for a second antenna-pointing metric are conveyed audibly. The antenna-pointing metrics may include, for example, signal strength, decoupling metric, and the like. According to one embodiment, the decoupling metric may be conveyed audibly, while the signal strength is presented visually. The audible indicator may be a single tone with a series of sequential pulses. For example, one to six pulses may be generated through a speaker, in which either the number of pulses and/or the delay between the pulses may indicate a value for the decoupling metric. In combination with the audible indicator of the decoupling metric, a row of light emitting diodes (LEDs) are provided to display feedback regarding signal strength. For example, three LEDs may be activated in a sequential fashion based on a measured RSSI value for one of the beams. A low RSSI may light up one of the LEDs, while a high RSSI may light up all three of the LEDs. Additional granularity for displaying signal strength may be achieved by using a combination of solid and blinking LED lights. For example, lighting the first LED and blinking the second LED may indicate a signal strength stronger than only lighting the first LED but not as strong as when two LEDs are activated.

If implemented in firmware and/or software, the functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Under general usage, disk and disc includes compact discs (CD), laser discs, optical discs, digital versatile discs (DVD), floppy disks, and blu-ray discs. Disks may reproduce data magnetically, and discs may reproduce data optically. Combinations of the above may also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present invention, disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
    measuring a first signal strength from a first beam of an antenna system pointed in a first direction, the first signal strength indicative of a signal intended for reception on the first beam;
    measuring a second signal strength from a second beam of the antenna system pointed in the first direction, the second signal strength indicative of the signal intended for reception on the first beam but received on the second beam;
    computing a first decoupling metric from the first signal strength and the second signal strength; and
    determining whether the decoupling metric exceeds a threshold value for multiple-input-multiple-output (MIMO) operation of the antenna system.

2. The method of claim 1, in which the step of measuring the first signal strength comprises measuring a Received Signal Strength Indicator (RSSI).

3. The method of claim 1, in which the step of computing the first decoupling metric comprises computing an absolute difference between the first signal strength and the second signal strength.

4. The method of claim 1, further comprising receiving the signal on the first beam while measuring the first signal strength and the second signal strength.

5. The method of claim 4, in which the signal is at least one of a pilot signal and a preamble signal.

6. The method of claim 1, further comprising:
    measuring a third signal strength from the antenna system pointed in a second direction;
    measuring a fourth signal strength from the antenna system pointed in the second direction; and
    computing a second decoupling metric from the third signal strength and the fourth signal strength.

7. The method of claim 6, further comprising:
    comparing the first decoupling metric with the second decoupling metric;
    selecting either the first direction or the second direction based on whether the first decoupling metric or the second decoupling metric is larger; and
    when the first decoupling metric and the second decoupling metric are approximately equal, selecting either the first direction or the second direction based on whether the values of the first signal strength and the second signal strength or the third signal strength and the fourth signal strength are larger.

8. The method of claim 1, in which the first beam and the second beam are orthogonal.

9. The method of claim 8, in which the first beam and the second beam are at least one of horizontally and vertically polarized, 45 degree and −45 degree polarized, and circular-right and circular-left polarized.

10. A computer program product, comprising:
a non-transitory computer-readable medium comprising:
code to measure a first signal strength from a first beam of an antenna system pointed in a first direction, the first signal strength indicative of a signal intended for reception on the first beam;
code to measure a second signal strength from a second beam of the antenna system pointed in the first direction, the second signal strength indicative of the signal intended for reception on the first beam but received on the second beam;
code to compute a first decoupling metric from the first signal strength and the second signal strength; and
code to determine whether the decoupling metric exceeds a threshold value for multiple-input-multiple-output (MIMO) operation of the antenna system.

11. The computer program product, of claim 10, in which the medium further comprises code to measure a Received Signal Strength Indicator (RSSI).

12. The computer program product, of claim 10, in which the medium further comprises code to compute an absolute difference between the first signal strength and the second signal strength.

13. The computer program product, of claim 10, in which the medium further comprises code to receive a first signal on the first beam while measuring the first signal strength and the second signal strength.

14. The computer program product, of claim 13, in which signal is at least one of a pilot signal and a preamble signal.

15. The computer program product, of claim 10, in which the medium further comprises:
code to measure a third signal strength from the first beam of the antenna system pointed in a second direction;
code to measure a fourth signal strength from the second beam of the antenna system pointed in the second direction; and
code to compute a second decoupling metric from the third signal strength and the fourth signal strength.

16. The computer program product, of claim 10, in which the medium further comprises:
code to compare the first decoupling metric with the second decoupling metric;
code to select either the first direction or the second direction based on whether the first decoupling metric or the second decoupling metric is larger; and
code to select either the first direction or the second direction based on whether the values of the first signal strength and the second signal strength or the third signal strength and the fourth signal strength are larger when the first decoupling metric and the second decoupling metric are approximately equal.

17. The computer program product of claim 10, in which the first beam and the second beam are orthogonal.

18. The computer program product of claim 17, in which the first beam and the second beam are at least one of horizontally and vertically polarized, 45 degree and −45 degree polarized, and circular-right and circular-left polarized.

19. An apparatus, comprising:
an interface to an antenna system having at least one antenna;
a memory; and
a processor coupled to the memory and the interface, in which the processor is configured:
to measure a first signal strength from a first beam of an antenna system pointed in a first direction, the first signal strength indicative of a signal intended for reception on the first beam;
to measure a second signal strength from a second beam of the antenna system pointed in the first direction, the second signal strength indicative of the signal intended for reception on the first beam but received on the second beam;
to compute a first decoupling metric from the first signal strength and the second signal strength; and
to determine whether the decoupling metric exceeds a threshold value for multiple-input-multiple-output (MIMO) operation of the antenna.

20. The apparatus of claim 19, in which the processor is configured to compute an absolute difference between the first signal strength and the second signal strength.

21. The apparatus of claim 19, in which the processor is configured to receive the signal on the first beam through a narrow beam before measuring the first signal strength.

22. The apparatus of claim 21, in which the processor is configured to receive a pilot signal through the antenna system to measure the first signal strength.

23. The apparatus of claim 19, in which the processor is configured:
to measure a third signal strength from the first beam of the antenna system pointed in a second direction;
to measure a fourth signal strength from the second beam of the antenna system pointed in the second direction; and
to compute a second decoupling metric from the third signal strength and the fourth signal strength.

24. The apparatus of claim 19, in which the first beam and the second beam are orthogonal.

25. The apparatus of claim 24, in which the first beam and the second beam are at least one of horizontally and vertically polarized, 45 degree and −45 degree polarized, and circular-right and circular-left polarized.

* * * * *